United States Patent
Dutta

[11] Patent Number: 5,972,731
[45] Date of Patent: Oct. 26, 1999

[54] SURFACE-EMISSION TYPE LIGHT-EMITTING DIODE AND FABRICATION PROCESS THEREFOR

[75] Inventor: Achyut Kumar Dutta, Tokyo, Japan

[73] Assignee: NEC Corporation, Japan

[21] Appl. No.: 09/061,622

[22] Filed: Apr. 16, 1998

Related U.S. Application Data

[62] Division of application No. 08/706,517, Sep. 4, 1996, Pat. No. 5,821,569.

[30] Foreign Application Priority Data

Sep. 4, 1995 [JP] Japan .................................... 7-226126

[51] Int. Cl.$^6$ .................................................. H01L 21/31
[52] U.S. Cl. ............................................. 438/39; 438/46
[58] Field of Search ................................. 438/39, 38, 40, 438/41, 46, 47, 767, 45; 372/46, 47, 96, 99, 101; 257/96, 98, 97, 99

[56] References Cited

U.S. PATENT DOCUMENTS

| | | | |
|---|---|---|---|
| 5,053,356 | 10/1991 | Mitsui et al. | 438/41 |
| 5,317,587 | 5/1994 | Ackley et al. | 438/39 |
| 5,400,354 | 3/1995 | Ludowise et al. | 372/46 |
| 5,493,577 | 2/1996 | Choquette et al. | 372/46 |
| 5,568,499 | 10/1996 | Lear | 372/96 |
| 5,696,023 | 12/1997 | Holonyak, Jr. et al. | 148/DIG. 116 |
| 5,724,374 | 3/1998 | Jewell | 372/45 |
| 5,729,566 | 3/1998 | Jewell | 372/46 |
| 5,776,792 | 7/1998 | Naito et al. | 438/31 |
| 5,838,715 | 11/1998 | Lorzine et al. | 372/101 |

OTHER PUBLICATIONS

Choquette et al, "Fabrication and Performace of Selectively Oxidized Vertical–Cavity Lasers", IEE Phtotonics Technology Letters, vol. 7, No. 11, Nov. 1995.

Ochiai et al, "Kinetics of Thermal Oxidation of AlAs in Water Vapor" Appl. Phys. Lett 68(14). Apr. 1, 1996.

McDougal et al "Electrically–Pumped Vertical–Cavity Lasers with AlxOy–Ga As Reflectors", IEE Photonics Technology Letters, vol. 8, No. 3, Mar. 1996.

*Primary Examiner*—Savitri Mulpuri
*Attorney, Agent, or Firm*—Hayes, Soloway, Hennessey, Grossman & Hage, P.C.

[57] ABSTRACT

An n-type GaAs layer as a buffer layer, an n-type $(Al_{0.7}Ga_{0.3})_{0.5}In_{0.5}P$ layer, an active layer, a p-type $(Al_{0.7}Ga_{0.3})_{0.5}In_{0.5}P$ layer, a thin layer of $Al_xGa_{1-x}As$ layer ($x \geq 0.9$), an $Al_{0.7}Ga_{0.3}As$ layer as a current spreading layer and a high doped p-type GaAs cap layer are sequentially grown on an n-type GaAs layer of a substrate. As the active layer, an $(Al_xGa_{1-x})_{0.5}In_{0.5}P$ based bulk or multi-quantum well is employed. As the current spreading layer, an $Al_xGa_{1-x}As$ ($x \geq 0.7$) is employed. The current spreading layer is a p-type III–IV compound semiconductor having wider band gap than a band gap of a material used for forming the active layer, and being established a lattice matching with the lower p-type cladding layer. After mesa etching up to the cladding layer, growth of selective oxide is performed at a part of the AlGaAs layer. BY this, a block layer (selective oxide of AlGaAs) is formed. By this blocking layer, a light output power and a coupling efficiency are improved.

5 Claims, 17 Drawing Sheets

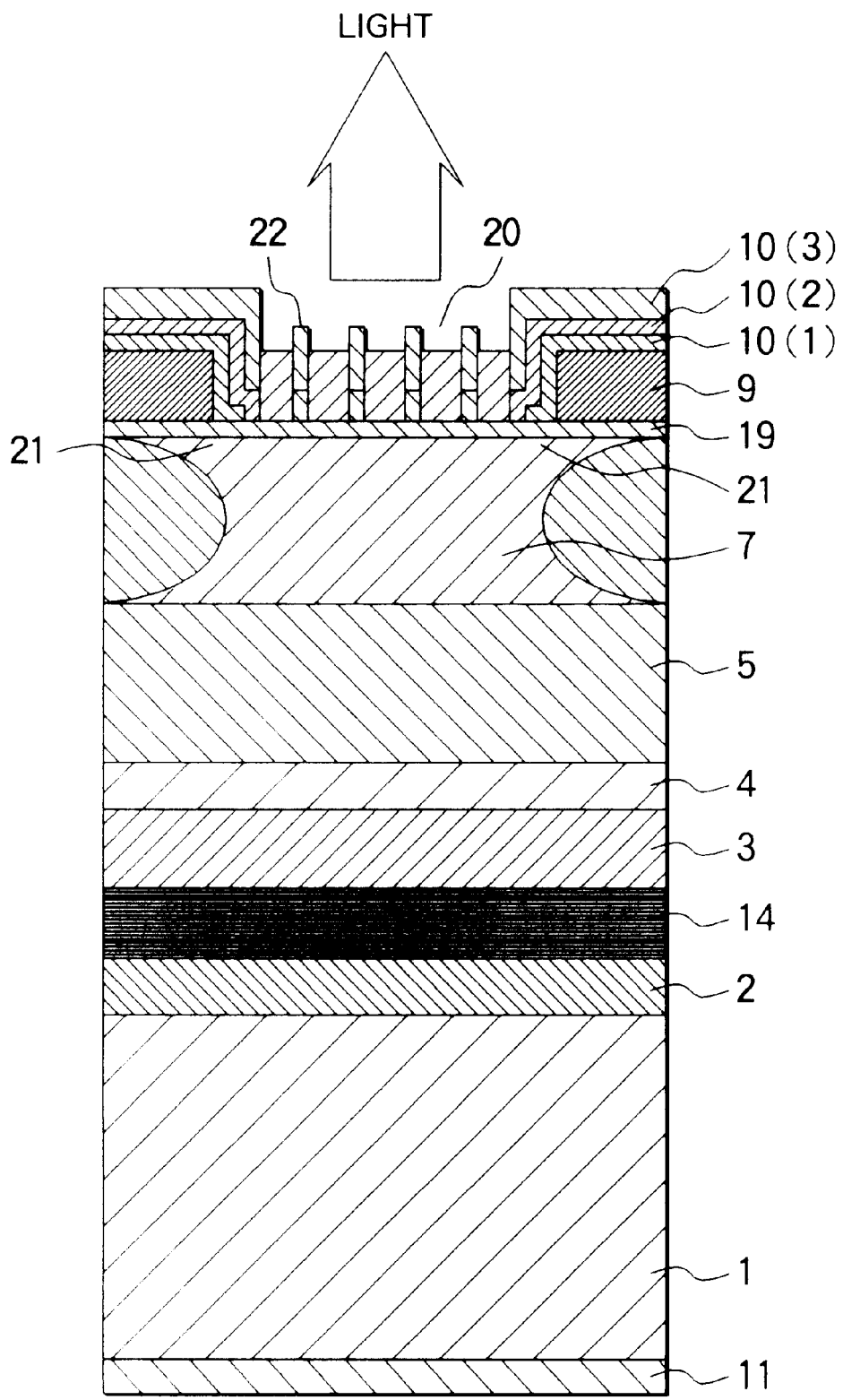

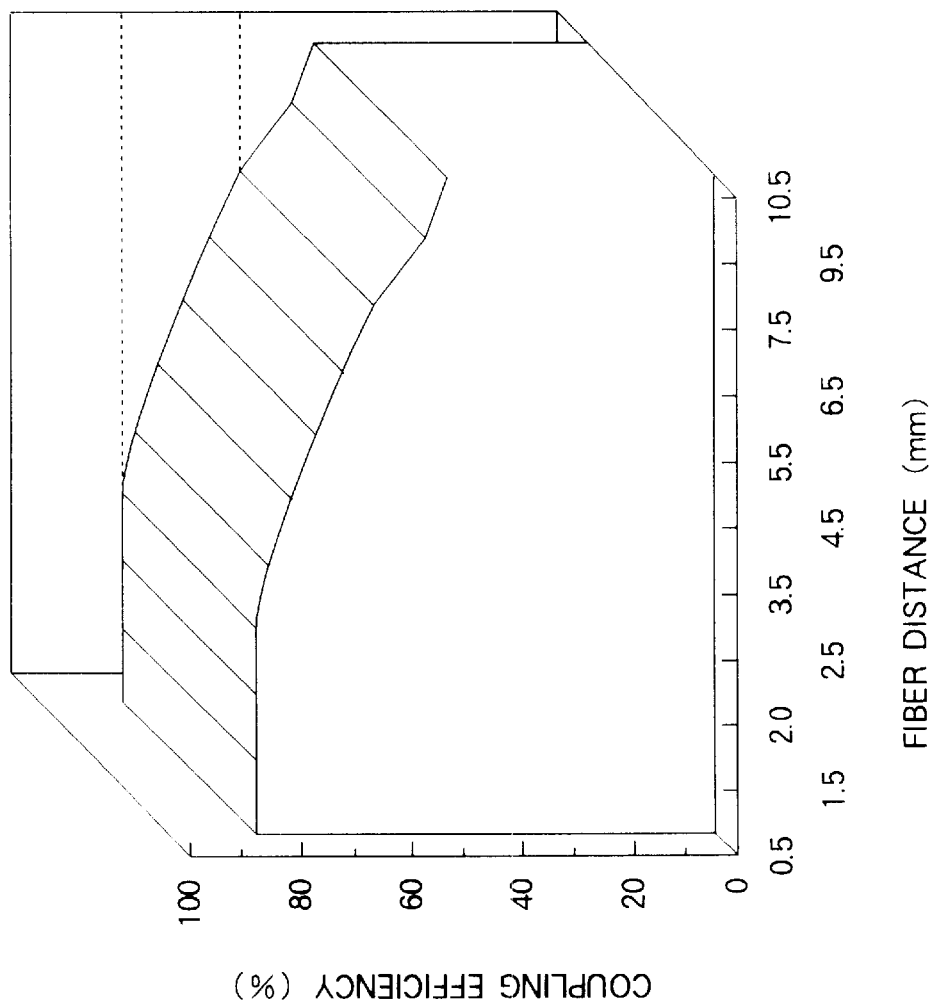

SURFACE-EMISSION TYPE LIGHT-EMITTING DIODE AND FABRICATION PROCESS THEREFOR

"This is a divisional of application(s) Ser. No. 08/706,517 filed on Sep. 4, 1996 ", U.S. Pat. No. 5,821,569.

BACKGROUND OF THE INVENTION

1. Field of the Invention

The present invention relates generally to an optical device to be employed for optical communication system. More specifically, the invention relates to a high-brightness visible light-emitting diode (LED) to be employed as high-efficiency light source in a plastic optical fiber (POF) based optical data-link system. Such LED is also applicable for an outdoor display device, an automotive indicator and so forth.

2. Description of the Related Art

A light output efficiency of the conventional light-emitting diode (LED) is mainly dependent on a structure and shape of an electrode to be used for injecting the current to junction. Conventionally fabricated surface-emission type light-emitting diode has a quadrangular or circular-shaped upper electrode located at the center portion thereof. The area and shape of the upper electrode significantly influence the light output efficiency. For achieving higher light output efficiency, it is required to make the area of the electrode smaller and the area of a light-emitting surface wider.

In the conventional LED, while employment of the quadrangular or circular-shaped electrode positioned at the center may facilitate fabrication, but it may cause disruption of gaussian beam pattern of an output beam. Especially, it may make the beam having the peak of the emission pattern at the circumferential edge portion of the electrode. The emission pattern attenuate according to increasing of distance from the electrode. This is caused by the fact that the current is concentrated at the center portion and not distributed at the position, distanced from the electrode. A beam intensity to be attained is directly proportional to a current density thereat. The conventional LED having wide beam pattern as set forth above cannot be employed in an optical data-link system. That is, even when a large core fiber is employed, the coupling efficiency is held low due to emission pattern.

One of typical examples of the conventional surface emission type LED is shown in FIGS. 1A, 1B and 2. FIGS. 1A and 1B show sections along an upper surface of an LED and an approximated near-field-emission. In FIGS. 1A and 1B, an n-type GaAs buffer layer 2, an n-type $(Al_xGa_{1-x})In_{1-x}P$ layer 3, an active layer 4, a p-type $(Al_xGa_{1-x})_{0.5}In_{0.5}P$ layer 5, a current spreading layer 7 and a p-type GaAs cap layer 8 are grown sequentially on an n-type GaAs substrate 1. For a p-type contact, quadrangular, circular or cross shaped electrode 28 is employed in the prior art. As the current spreading layer 7, a thick $Al_{0.7}Ga_{0.3}As$ layer is normally employed.

In FIG. 2, an approximated near-field-pattern of a light intensity 30 for LED having a quadrangular or circular shaped electrode located at the center, is shown. As shown, the light intensity 30 is maximum around the peripheral edge portion of the electrode and becomes lower at distance position from the electrode. This represents crowding of the current at the center and not distributing far away for the electrode. In this case, it is impossible to enhance the output efficiency as expected. In order to avoid crowding of current around the electrode, a blocking layer 31 is typically employed in front of the AlGaAs layer (current spreading layer) 7. FIG. 3 shows another example of the conventional LED having the blocking layer 31. Requirement of regrowth makes production cost of the LED higher. Also, darkness at the center portion in the case of circular electrode makes the coupling efficiency lowers even with a large core fiber. It is highly desirable to provide an LED structure which can provide high coupling efficiency and is suitable for mass scale production.

III–V semiconductor based visible LED (wavelength is in a range from 580 to 670 nm) which has quadrangular/circular shaped electrode at the center, have been disclosed in various publications and patent publications. In every case, quadrangular or circular shaped electrode provided at the center is used as upper contact for injecting the current. One of typical examples can be found in the paper of Sugawara et al., "Japan Journal of Applied Physics, Part 1, Vol. 31, No. 8, pp 2446 to 2451, 1992". In this report, a cross shaped electrode along with blocking layer were used in the surface-emission type LED.

However, the light output efficiency is still beyond its practical application. To enhance current spreading outside the contact, a thick window layer having low resistivity is required. Even with such thick window layer, the current spreading outside the contact is limited to a certain level. Thus, the light intensity is much lower than that required for practical application. However, in application, such as short distance data-link system, especially based on POF, employment of the conventional LED exhibits low coupling efficiency and thus is impractical in a POF based communication system. For POF based data link application, it would be highly desirable to design the LED which offers not only high brightness but also high coupling efficiency. In addition, it is highly desirable to reduce a fabrication cost as low as possible in order to contribute for lowering of a cost for the system.

Japanese Unexamined Patent Publication (Kokai) No. Heisei 2-174272 discloses a high brightness LED. In the disclosed art, the brightness of the LED is enhanced employing n-p-n-p structure under the contact, which assists for spreading the current outside the contact. The fabrication process of the conventional LED as disclosed in the above mentioned publication includes a first step of sequentially growing of an N-type junction layer, a P-type light emitting layer and an N-type transparent layer on an N-type semiconductor substrate, a second step of performing photo-etching for the N-type transparent layer, a third step of performing diffusion of Zn for forming a current spreading region, a fourth step of performing photo-etching for isolation of elements and polishing of the lower portion of the element, and fifth step of forming electrode on upper and lower portions of the element. The main drawback of the disclosed invention is that prior to form p-type contact, a mesa structure reaching to the active region has to be formed in a light emitting surface to define a current path. Also, a dopant, such as Zn, has to be diffused at high temperature environment. The post-growth high temperature treatment for Zn diffusion influences on performance characteristics due to degradation of the active region. As the light emitting surface with high p-doping is used, a large fraction of light (depending upon the light energy) can be absorbed in the diffused layer. In fabrication of this type of LED, several times of processes are required to cause high fabrication cost of the LED. In addition, difficulty may be encountered in fabrication of high speed LED for high capacitance caused by wide contact area.

Japanese Unexamined Patent Publication No. Heisei 3-20 190287 discloses a high brightness LED. In the disclosed conventional LED, a plurality of light emitting regions of mesa structure are arranged on a direction. Each of the light emitting regions is formed so that edges of the light emitting region perpendicular to the arranging direction thereof become forward mesa structure and remaining edges parallel to the arranging direction become reverse mesa structure. And an electrode is lead from only one of edges having forward mesa structure. In such LED array, for facilitating wire bonding, the contact was made on the upper layer following the mesa formation. In this case, the shape of the contact is varied to achieve high light output. The disclosed prior art is completely related to the LED array, and since the mesa structure is required to be formed prior to the electrode formation, there should have difficulties in formation of the electrode unless a thick contact is formed. This is not only results in increasing of the fabrication cost of the LED, but also impractical for application in fabrication of single LED.

Japanese Unexamined Patent Publication No. Heisei 5-211345 discloses an LED. In the disclosed prior art, between a p-type clad layer and a cap layer, an n-type current blocking layer is provided. In conjunction therewith, a portion to be the peripheral edge of the upper electrode in the current blocking layer is converted into p-type by diffusion or ion implantation of a p-type impurity through a portion of a light extraction surfaces on the cap layer where an upper electrode is not mounted. In such prior art, the current blocking layer, the type of which is opposite type (p or n type) of compound semiconductor, and diffusion at high temperature are used for fabrication of the LED. In addition, the configuration of the upper electrode of the LED is impractical to be employed as a light source in the optical data-link system for low coupling efficiency. Furthermore, high temperature treatment degrades the optical characteristics due to dopant diffusion and also crystal defect.

The Japanese Unexamined Patent Publication No. Heisei 4-174567 discloses a high brightness LED array to be employed in a printer. The disclosed conventional surface emission type light emitting diode array has a plurality of surface emission type light emitting diodes extracting a light generated in a plurality of active layers provided on a common substrate, through light extracting surfaces formed at opposite side of the substrate. Also, a light reflector layer of semiconductor multiple layers are provided. The light reflector layers are respectively provided in between active layer of surface emission type light emitting diode and the common substrate for reflecting the light by light wave interference. In such prior art, a bottom distributed bragg reflector layer (DBR) is used for reflecting the light back from the substrate. In this case, the same idea for fabricating the surface emission laser is implemented. For the DBR, pairs of GaAs/AlAs is used for reflecting a 880 nm wavelength light toward the substrate. The types and number of pairs to be used in the DBR should be dependent on the output emission wavelength. Also, the same DBR cannot be used in the visible LED where 600 to 650 nm wavelength are concerned.

Namely, the disclosed LED array can be used in the printer but cannot be employed in the data link system. This is because the configuration of the upper electrode is the same as that of the conventional LED as set forth above. The coupling efficiency with a fiber becomes quite low as such LED is employed.

Japanese Unexamined Patent Publication No. Heisei 4-259263 discloses a visible LED employing InAlGaP. The disclosed conventional semiconductor light emitting element is fabricated by sequentially growing n-type clad layer formed of InGaAlP type material, active layer and p-type clad layer, on an n-type GaAs substrate to form a double heterostructure portion. A p-type intermediate band gap layer is formed on the double heterostructure portion, and a p-type contact layer is selectively formed on the intermediate band gap layer. The semiconductor light emitting element is consisted of an active layer formed with an ordered layer having natural super lattice, and the intermediate band gap layer 15 formed with a non-ordered layer, in which the natural super lattice is extinguished by Zn diffusion. By making the band gap of the intermediate band gap layer greater than the band gap of the active layer, the light from the light emitting region can be extracted without blocking by the electrode at the light extracting side. In the disclosed prior art, an additional layer of InGaP, band gap wider than the layer used in active region is used in order to avoid Zn diffusion into the active region. No additional layer for current spreading is used. As set forth above, this type of the visible LED with centrally located circular shaped electrode can not be used in the short distance data link system.

As explained in the above, the LED structure so far proposed, has light output and coupling efficiency, not enough for using in the short distance data link system, especially where POF based system are concerned. This is because, conventional LED has low output power and also low coupling efficiency with the POF. Therefore, it would be highly desirable to design a high brightness visible LED which could be fabricated in low cost and suitable for mass scale production.

SUMMARY OF THE INVENTION

It is an object of the present invention to provide a surface emission type light-emitting diode and production process therefor, which can offer high output, high coupling efficiency with POF, and high brightness with uniformly spreading current outside a contact.

The problems set forth above may be alleviated for its potential application in POF or silica based data link system or in any other display system.

These problems can be alleviated by uniformly distributing current on the emitting surface, and this can be possible by preventing current from spreading toward bonding region. If current is not allowed to spread toward the bonding region, current could be injected only to the junction of the emitting surface, circular shaped emitting surface is used to match the outgoing beam shape with the fiber core, resulting in increased coupling efficiency. Uniform emission pattern is also achieved by optimizing (selection thereof depends on dimension of fiber) the emitting surface diameter, the selection of which also dependent on fiber dimension. The LEDs proposed in the invention can also be useful in display system.

BRIEF DESCRIPTION OF THE DRAWINGS

The present invention will be understood more fully from the detailed description given herebelow and from the accompanying drawings of the preferred embodiment of the invention, which, however, should not be taken to be limitative to the present invention, but are for explanation and understanding only.

In the drawings:

FIG. 15 is an illustration showing the tenth embodiment of the LED having the ring shaped electrode and the bottomed DBR;

FIG. 17 is a graph showing a result of calculation showing dependencies of coupling efficiency on lens distance and fiber distance.

DESCRIPTION OF THE PREFERRED EMBODIMENT

The preferred embodiments of the present invention will be discussed in detail with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention.

Figure 1A:
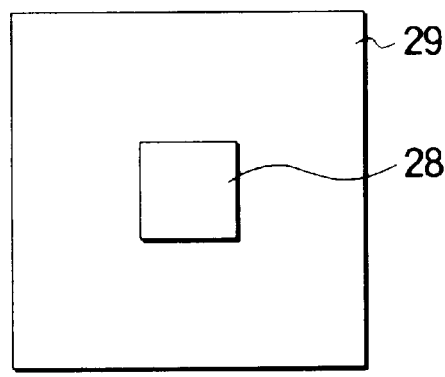
FIGS. 1A and 1B are schematic diagram of the conventional visible LED.
Figure 1B:
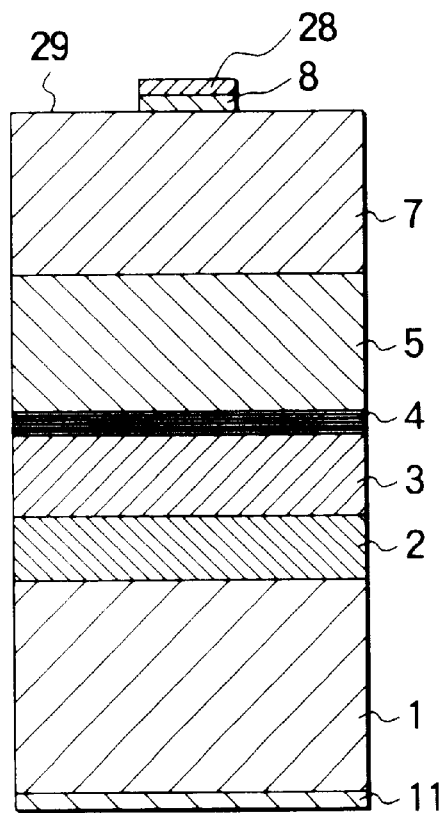
Figure 2:
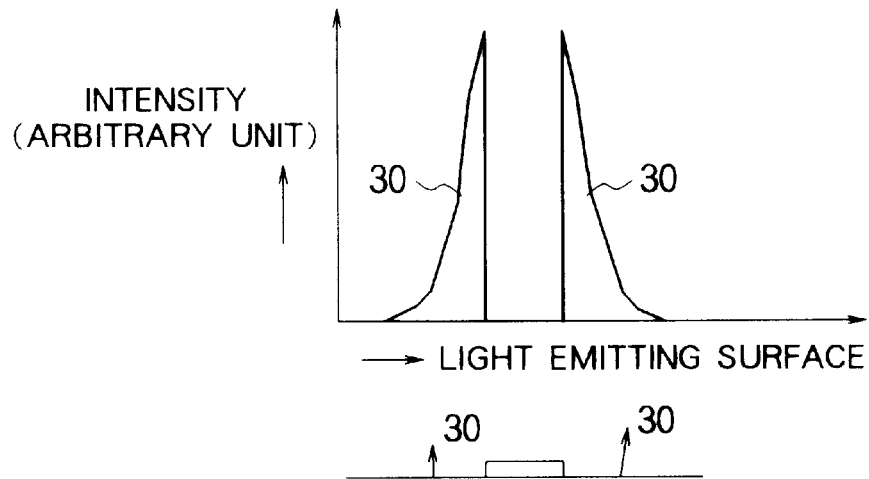
FIG. 2 is an illustration showing approximated near field pattern of the LED of FIGS. 1A and 1B.
Figure 3:
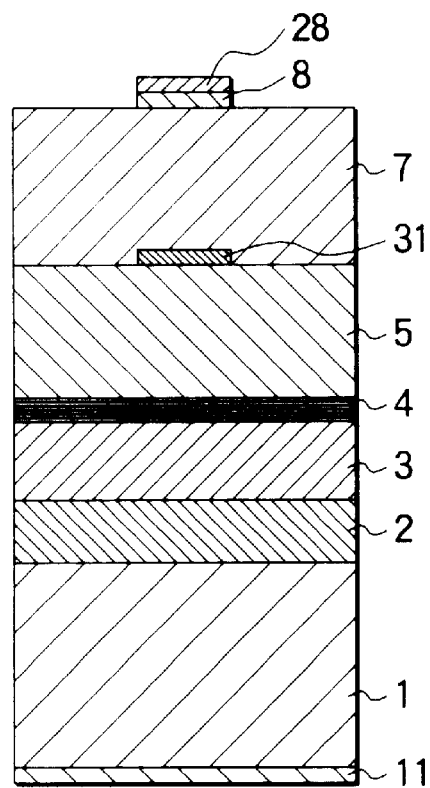
FIG. 3 is a schematic diagram showing a structure of the conventional LED.
Figure 4A:
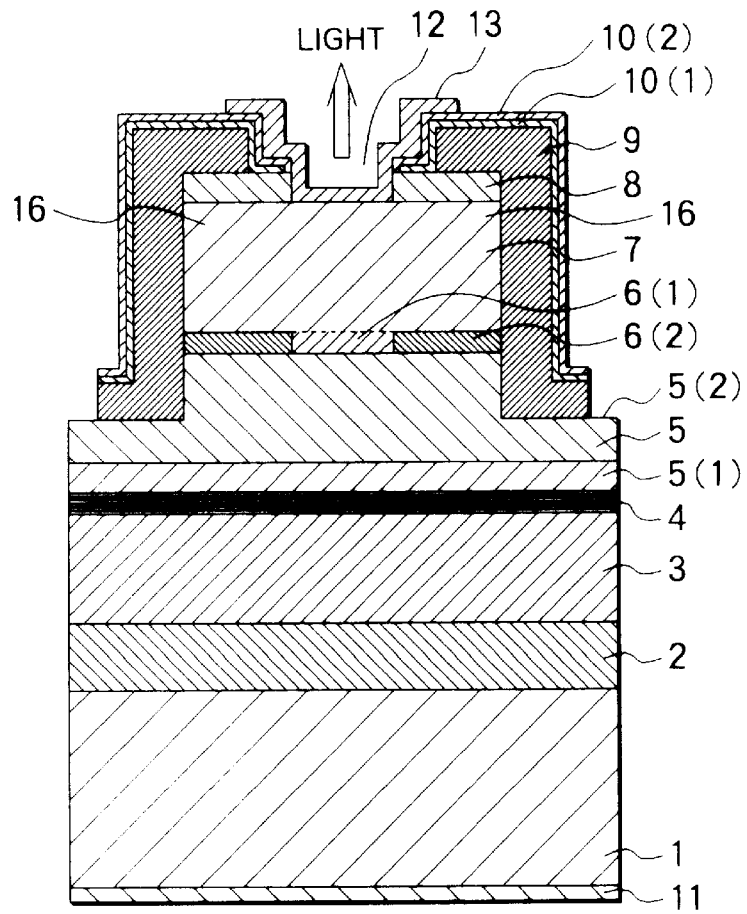
FIGS. 4A and 4B are illustration showing the first embodiment of an LED according to the present invention.
Figure 4B:
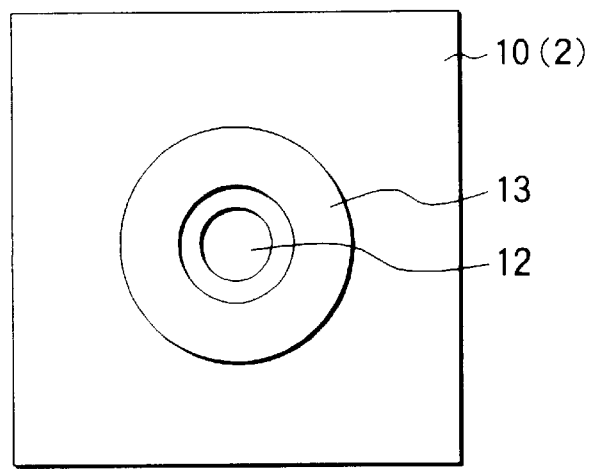

FIGS. 4A and 4B are explanatory illustration showing a structure of the first embodiment of a visible LED according to the present invention. FIG. 4A is a section and FIG. 4B is a top plan view. As shown, an n-type GaAs layer 2 as a buffer layer, an n-type $(Al_{0.7}Ga_{0.3})_{0.5}In_{0.5}P$ layer 3, an active layer 4, a p-type $(Al_{0.7}Ga_{0.3})_{0.5}In_{0.5}P$ layer 5, a thin layer of $Al_xGa_{1-x}As$ layer 6 ($x \geq 0.9$), a current spreading layer $Al_{0.7}Ga_{0.3}As$ layer 7, a high doped p-type GaAs cap layer 8 are sequentially grown on a substrate n-type GaAs layer 1. As the active layer 4, a bulk or multiquantum well of $(Al_xGa_{1-x})_{0.5}In_{0.5}P$ based material of a desired wavelength can be used. In the preferred embodiment, $Al_xGa_{1-x}As$ with x content of $\geq 0.7$ is used as the current spreading layer 7. However, it also covers all p-type III–V compound semiconductor having a band gap wider than that of used as active layer and also have the lattice matching with its underlying p-type cladding layer.

Since high doping is necessary in the current spreading layer 7 and the cap layer 8, dopant diffusion into the active layer may deteriorate optical characteristics of the LED during epitaxial growth. In order to prevent the dopant from diffusing into the active layer, a spacer layer 5(1) having a thickness depending on thicknesses of the current spreading layer 7 and the cap layer 8, is formed following formation of the active layer 4. As the spacer layer, the same material as the p-type material with low doped used as the p-type clapping layer 6 may be used.

After mesa etching reaching up to p-type cladding layer 5(2), selective oxide growth in part of AlGaAs 6(2) is performed. This can be done by heating a sample at a temperature over 400° C. in steam atmosphere which can be realized by water bubbling. As the Al contents in AlGaAs is more than 0.9, selective oxide growth can be done in the layer 6(2). The selective oxide growth should be selected in such a way that the opening portion (unoxide portion) 6(1) is equal to the diameter of a light emitting surface 12.

A current is injected to a junction through the opening portion 6(1). In the preferred embodiment, a thin layer of AlGaAs 6 is used. However, any type of III–V compound semiconductor which has crystal matching with the cladding layer 5 and has capability of selective oxidation (e.g. AlAs) may be used for forming the thin layer 6. After epitaxial growth, a silicon nitride or silicon oxide 9 in a thickness greater than or equal to 150 nm is deposited at a temperature lower than or equal to 500° C. Subsequently, an opening window through the dielectric layer 9 for the light emitting surface 12 is formed. Then, a p-type contact electrode 10 (10(1) and 10(2)) is formed using a lift-off process.

In the LED, as a current density is higher in comparison with a current density of the optical device like a laser diode, the contact resistance mainly induced due to the p-type electrode, should be as low as 1 ohm for long time reliability. Therefore, as the p-type contact, more reliable metallization has to be selected in order to avoid any spike formation in the GaAs cap layer. For the p-type contact, Au:Zn or Ti/Pt/Au or Ni/Zn/Au can be used with much higher reliability in comparison with metallization of the normal kind, such as Cr:Au.

For using the LED in the data link system, the optical coupling efficiency with the fiber is more concerned. Therefore, the emission surface should be designed so that a maximum coupling efficiency can be achieved. The coupling efficiency is mainly depend on several factors: the type of the fiber to be used and the emission surface of the LED to be used. In case of the LED, the light emitting surface should be designed in such a way that the more light is concentrated at the center region rather than outer side. The coupling efficiency is much more dependent on selection of the emitting surface diameter (namely the diameter of the upper surface). The coupling efficiency can be maximized by optimizing the diameter of the upper electrode which corresponds the light emitting surface.

As set forth above, when the conventional electrode which is mainly provided at the center portion, is employed, the output light is broadened at the outer side of the LED to lower the coupling efficiency. If a ring shaped electrode and a current blocking under the bonding region 16 are employed, the light may be concentrated at the center to achieve higher coupling efficiency in comparison with that using the conventional LED. The design of the circular electrode along with the circular light emitting surface is also important factor for enhancing the coupling efficiency and its brightness. In order to enhance the output power, the diameter of the electrode (diameter of the light emitting surface) should be optimized.

Figure 5:
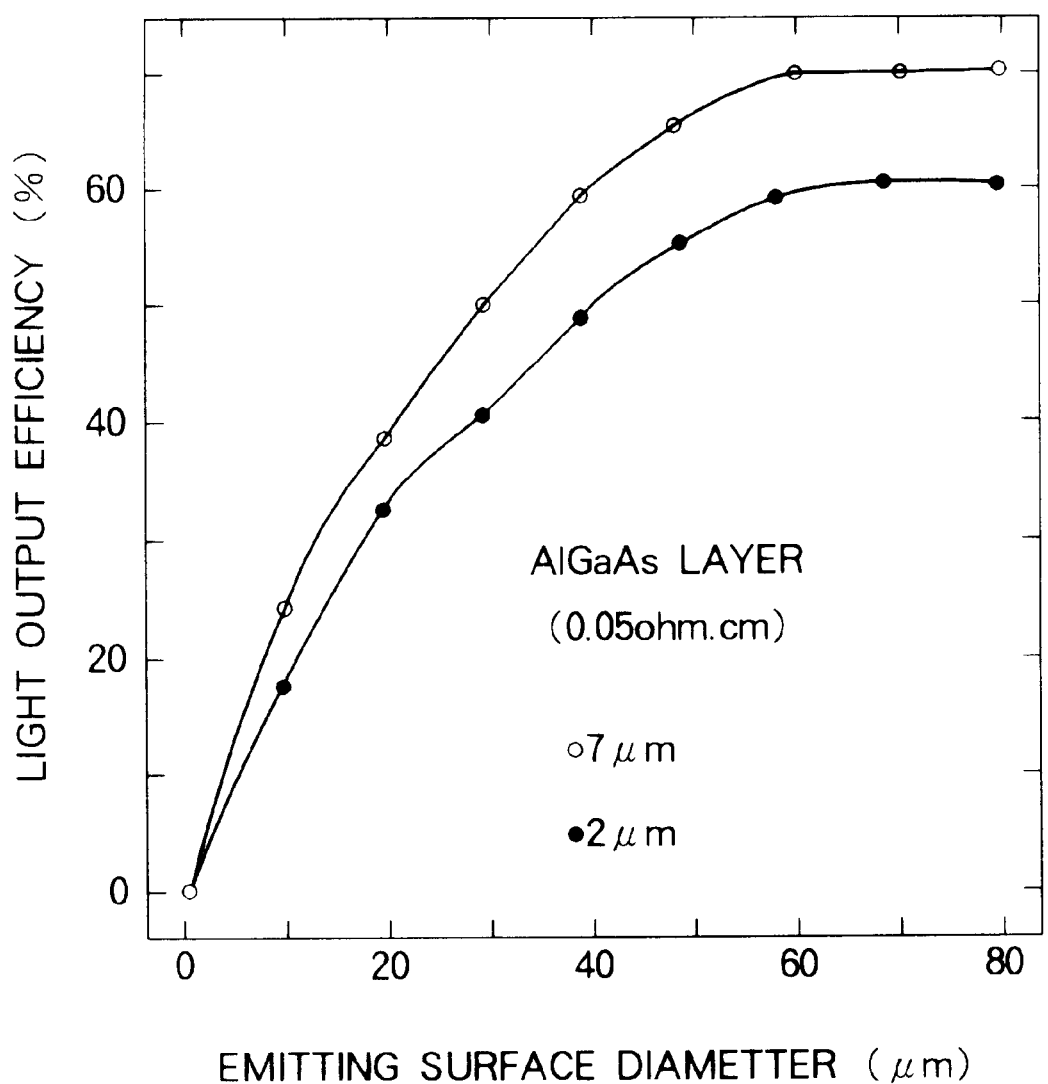
FIG. 5 is a graph showing a result of calculation representing dependency of light output efficiency on a dimension of light emitting surface.

FIG. 5 shows a dependency of the light emitting surface diameter on the light output efficiency as a function of current spreading layer (AlGaAs) thickness. When the thicker current spreading layer is employed, higher brightness can be attained with a given fixed light emitting surface area. However, when the light emitting surface is widened, the light output efficiency becomes closer to that of the LED having thicker current spreading layer. In order to achieve the maximum coupling efficiency ($\geq 50\%$) with the fiber, the diameter of the light emitting surface should be designed in such a way that ratio of the fiber core diameter to the light emitting surface is greater than or equal to 5. It has been found that if the step index (SI) POF fiber with the core size of 0.98 mm and numerical aperture (NA) of 0.5 are used, the ring diameter (light emitting surface) to be used should be as low as 100 $\mu$m with achieving the coupling efficiency higher than or equal to 80%.

After forming the p-type contact, the Au $10(2)$ is plated on the p-type contact or partially on the portion where a wire bonding is effected, for facilitating wire bonding. This is followed by covering the light emitting surface 12 by a passivation layer 13. For the passivation layer 13. alumina ($Al_2O_3$), silicon oxide ($SiO_2$) or silicon nitride ($SiN_x$) can be used. The passivation layer 13 has to be deposited at a room temperature or at a temperature lower than or equal to 200° C. The passivation layer 13 prevents the light emitting surface 12 from absorbing water molecular or oxygen from the environment and thus makes device reliable for operation over a long period. After formation of the passivation layer 13, the back side of the substrate is polished to around 150 $\mu$m. Then, the n-type contact 11 is formed thereon. For the n-type contact 11, Au:Ge/Ni/Au can be used. After formation of the n-type contact 11 on the back side of the polished substrate, each LED is scrubbed for the packaging. The use of the blocking layer (in this case selective AlGaAs oxide) and simple structure of LED is effective not only for improving light output power and coupling efficiency, but also for minimizing fabrication cost of the LED.

Figure 6:
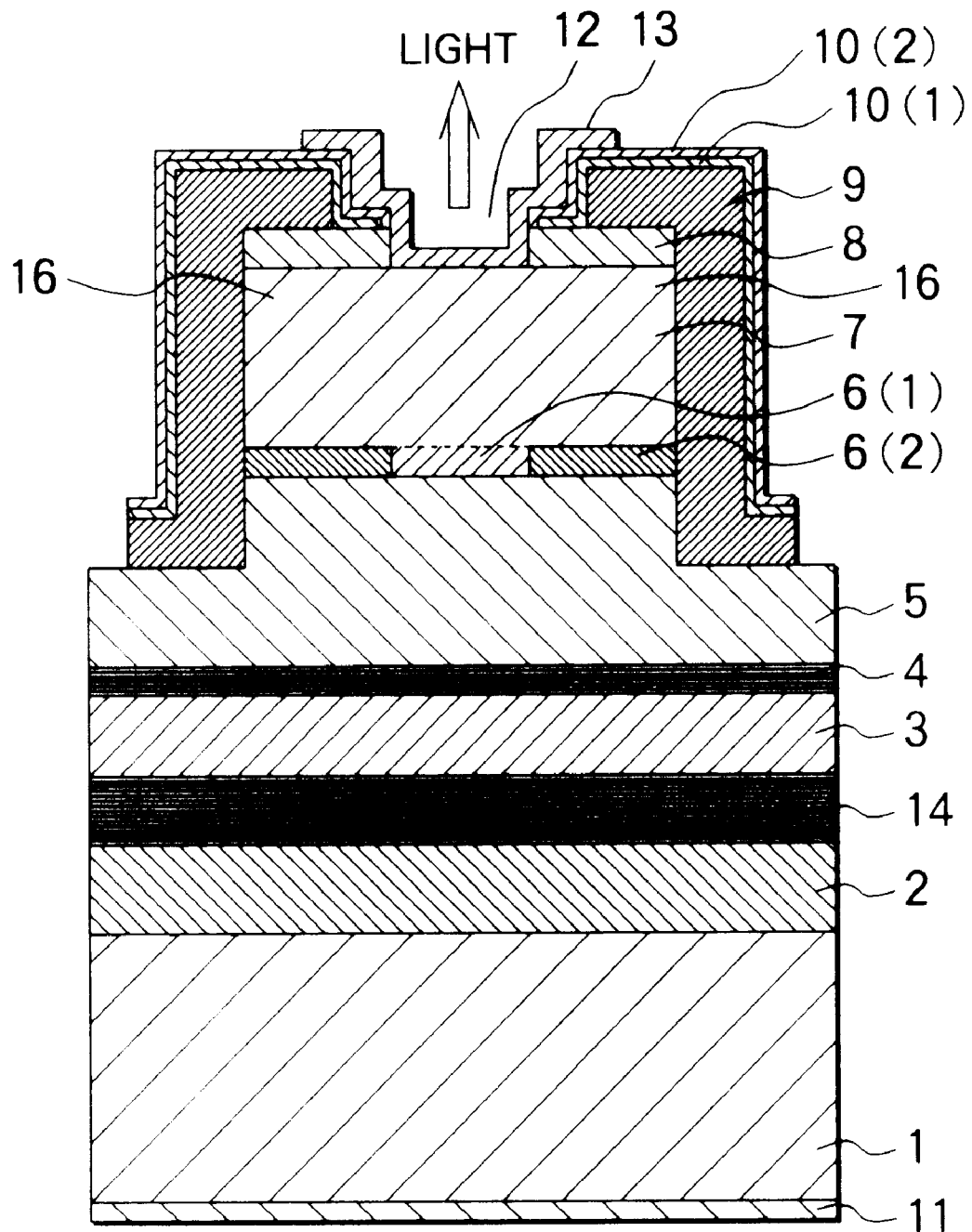
FIG. 6 is an illustration showing the second embodiment of the LED having a selective oxide layer as a DBR and a block layer.

FIG. 6 shows an explanatory diagram of the second embodiment of the LED, in which like parts to the foregoing first embodiment will be indicated by the like reference numerals in the first embodiment for simplification of disclosure with avoiding redundant discussion. In the second embodiment, the distributed bragg reflector (DBR) mirror 14 is grown on the buffer layer prior to growing of the cladding layer 3, the active layer 4 and the current spreading layer 7. The DBR to be used as the mirror 14, consists of the semiconductor pairs of $14(1)$ and $14(2)$ having high refraction index difference. Number and the type of the pairs also determine the level of the reflection of the DBR. The semiconductor layer to be used as the DBR should also have low absorbency for the emitted light.

Figure 7A:
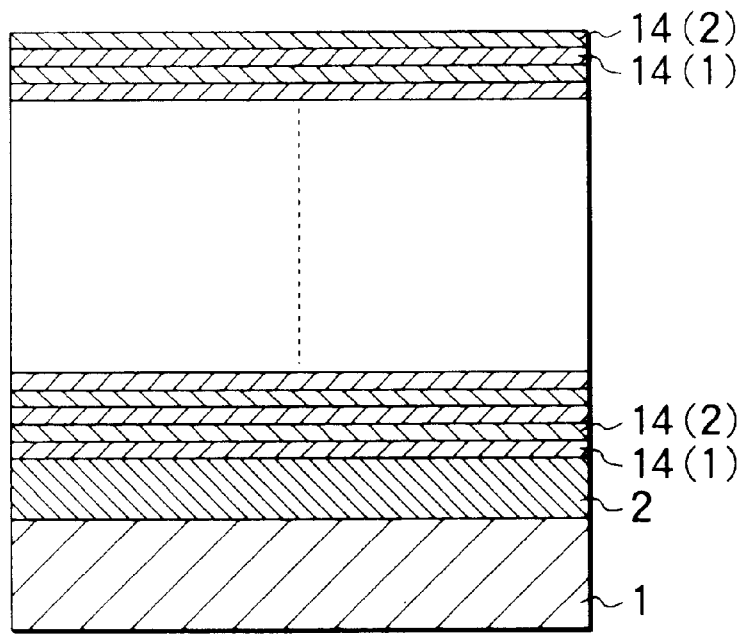
FIG. 7A and 7B are an illustrations showing a DBR structure employed in the second, fourth, sixth, eighth and twelfth embodiment of the LEDs together with reflection index characteristics.
Figure 7B:
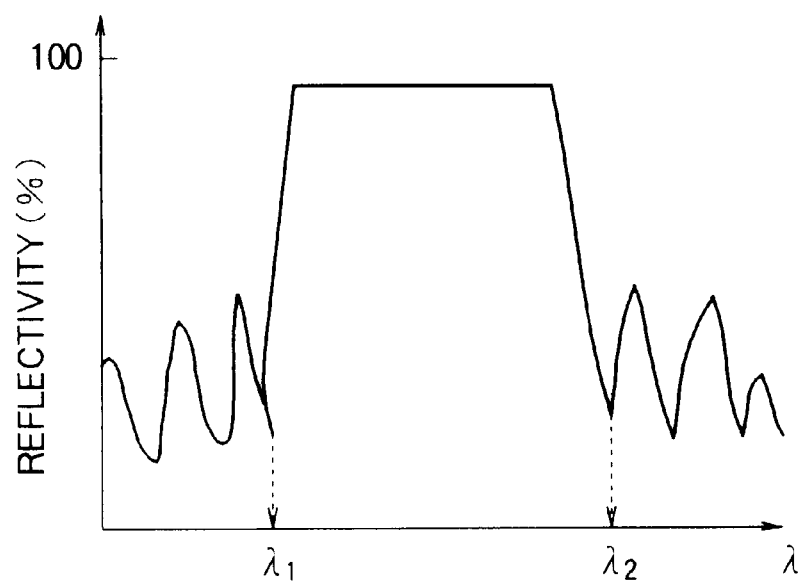

FIGS. 7A and 7B show explanatory example of the DBR along with its approximated reflecting characteristics. As set forth above, number of pairs as well as their type to be used in the pairs are dependent on the output light wavelength. In the optical device, especially the LED, as emission spectra covers the broad wavelength, the DBR to be used should have high reflectivity in broad wavelength range. As shown in FIG. 7B, the maximum reflectivity in broad wavelength, ranging from $\lambda_1$ to $\lambda_2$ should be achieved. This would assist to achieve the maximum reflectivity over the wafer area, while there will be shifting of the DBR reflectivity due to non-uniformity of the thickness, if any. In designing LED of 650 nm, AlAs, $Al_xGa_{1-x}A$ ($x \geq 0.45$), $(Al_xGa_{1-x})_{0.5}In_{0.5}P$ ($x \geq 0.45$), $Ga_{0.5}In_{0.5}P$ or GaAs can be used as DBR materials. The single DBR or discrete DBR can be used to achieve the broad wavelength ranges.

Table 1 and table 2 summarize pairs type and the DBR characteristics usable in designing visible LED of wavelength 650 nm.

TABLE 1

Summarizing the DBR type and its characteristics usable in the visible LED

| Pair Type (DBR type) | No. of Pairs | Reflectivity (%) | Wavelength Ranges $\lambda_1$–$\lambda_2$(nm) |
|---|---|---|---|
| AlAs/ $Al_{0.5}Ga_{0.5}As$ | $\geq 20$ | 99.9 | 620–685 |
| $Al_{0.5}In_{0.5}P$/ $(Al_{0.5}Ga_{0.5})_{0.5}In_{0.5}P$ | $\geq 15$ | 99.9 | 630–670 |
| $AL_{0.5}In_{0.5}P$/ $Ga_{0.5}In_{0.5}P$ | $\geq 25$ | 99.9 | 620–680 |
| AlAs/ $(Al_{0.5}Ga_{0.5})_{0.5}In_{0.5}P$ | $\geq 15$ | 99.9 | 615–685 |
| AlAs/ GaAs | $\geq 15$ | 90.0 | 610–685 |
| $(Al_{0.95}Ga_{0.05})_{0.5}In_{0.5}P$/ $(Al_{0.02}Ga_{0.98})_{0.5}In_{0.5}P$ | $\geq 30$ | 99 | 620–680 |
| $Al_{0.5}Ga_{0.5}As$/ $(Al_{0.95}Ga_{0.05})_{0.5}In_{0.5}P$/ | $\geq 30$ | >95 | 625–675 |
| $Al_{0.5}Ga_{0.5}As$/ GaAs | $\geq 15$ | >82 | 600–700 |
| $Al_{0.5}In_{0.5}P$ GaAs | $\geq 15$ | >90 | 610–685 |
| $(Al_{0.5}Ga_{0.5})_{0.5}In_{0.5}P$/ $(Al_{0.95}Ga_{0.05})_{0.5}In_{0.5}P$ | $\geq 15$ | >95 | 625–685 |

TABLE 2

Summarizing the DBR type and its characteristics usable in the visible LED

| Pair Type (DBR type) | No. of Pairs | Reflectivity (%) | Wavelength Ranges $\lambda_1$–$\lambda_2$ (nm) |
|---|---|---|---|
| $AlAs/Al_{0.5}Ga_{0.5}As$ + $Al_{0.5}Ga_{0.5}As$/ $(Al_{0.95}Ga_{0.05})_{0.5}In_{0.5}P$ | 10 + 10 | 99.9 | 610–690 |
| GaAs/AlAs + $(Al_{0.95}Ga_{0.05})_{0.5}In_{0.5}P$/ $Ga_{0.5}In_{0.5}P$ | 5 + 10 | 93.0 | 606–698 |

In designing DBR, formation of the graded junction to minimize its resistance is also important similarly to the reflection characteristics. For this, super lattice or graded junction matching with pairs is to be used. After formation of the DBR 14, other layers, such as the n-type cladding layer 4, the active layer 4, p-type cladding layer 5, the current spreading layer 7 and the p-type GaAs cap layer 8 are sequentially grown in the single chamber. Other processes following this step are the same as those described in the first embodiment. Therefore, discussed for the subsequent steps is neglected for maintaining the disclosure simple enough for facilitating clear understanding of the present invention.

Figure 8:
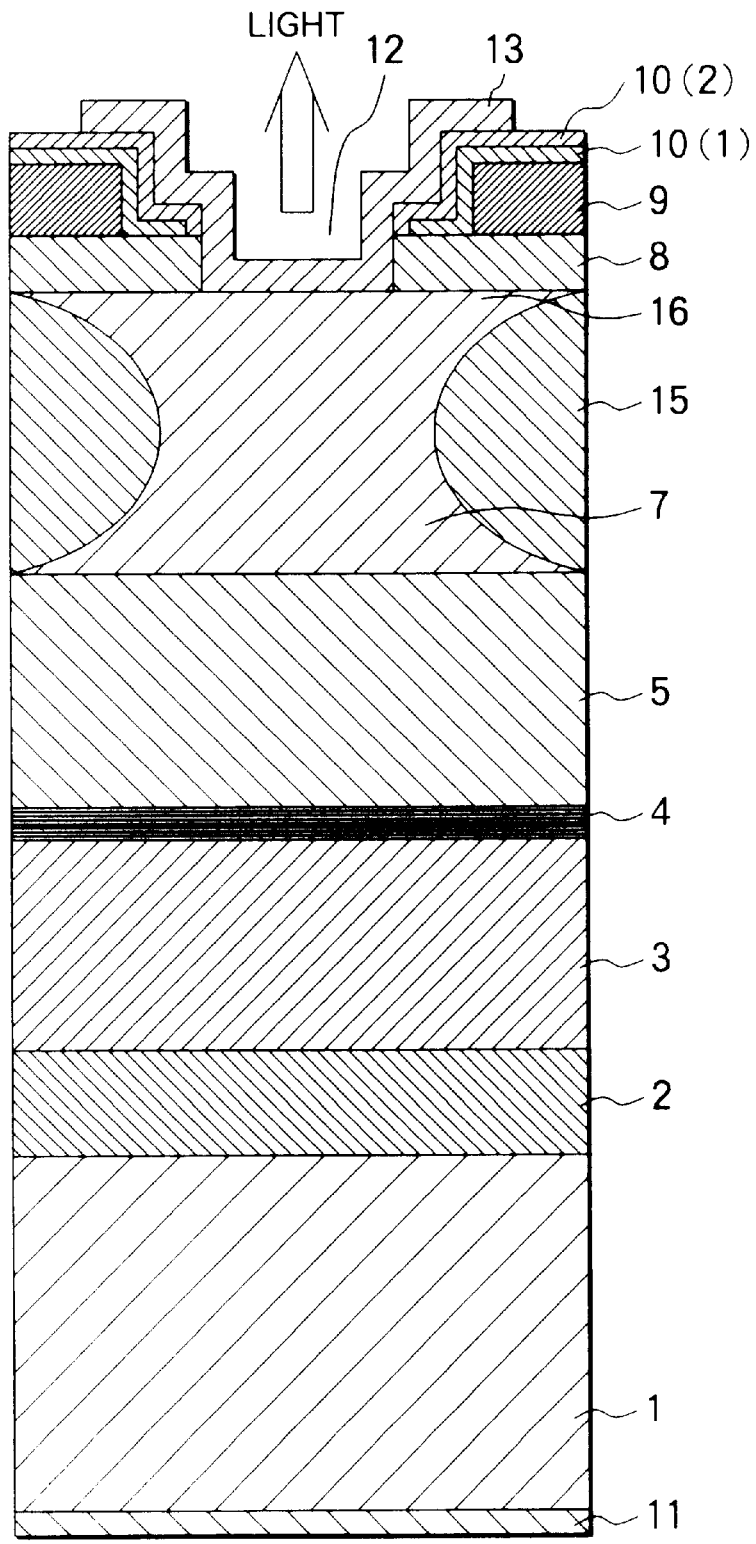
FIG. 8 is an illustration showing the third embodiment of the LED having an ion implantation blocking layer.

FIG. 8 is an explanatory diagram showing the proposed structure of the third embodiment of LED, in which the like parts are indicated by the like reference numerals in the first embodiment so that the repeated explanations are omitted. In the third embodiment, mesa etching is not required. Before deposition of dielectric layer 9, such as silicon oxide or silicon nitride, proton implantation 15 is performed after covering the light emitting surface by the thick resist or any other types of materials which can be etched selectively. The proton implantation is done to make the high resistive region for avoiding the current from spreading toward the bonding region 16. The selective oxide layer 6(2) used in the first embodiment is not required in the shown embodiment. However, it is also covers the LED structure where the ion implantation along with the selective oxide layer is also used. The use of ion implantation along with the blocking layer can help to enhance light output and coupling efficiency. The processes following to this are already explained in the first embodiment, so that the repeated explanation thereof is omitted.

Figure 9:
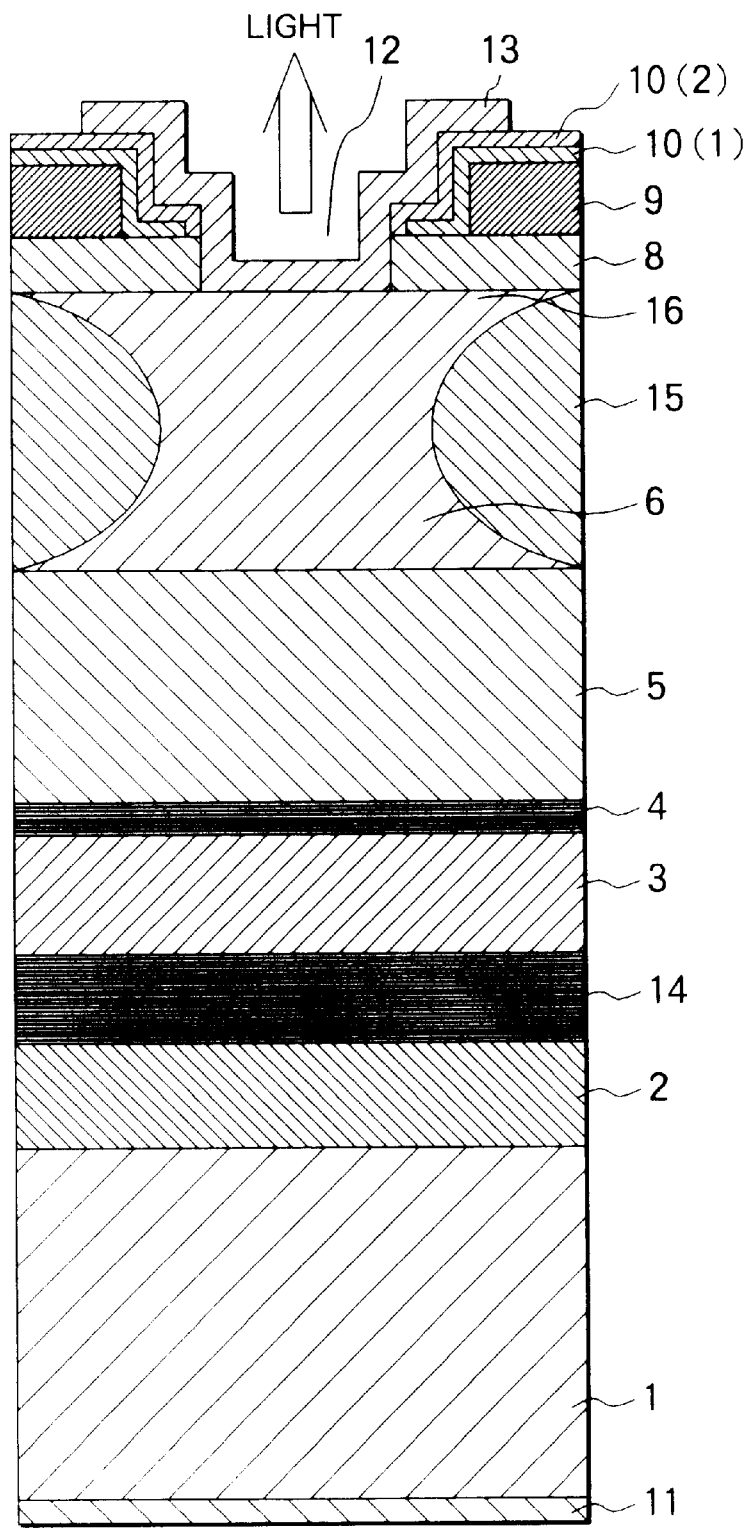
FIG. 9 is an illustration showing the fourth embodiment of the LED having the ion implantation block layer and a bottomed DBR.

FIG. 9 is an explanatory diagram showing the proposed structure of the fourth embodiment of the LED according to the present invention. In the shown embodiment, the like parts are represented by the like reference numerals in the first, second and third embodiments so that the repeated explanation can be omitted. In the fourth embodiment, after formation of the DBR 14, the n-type cladding layer 3, the active layer 4 and the p-type cladding layer 5 are sequentially grown. The current blocking region is formed by way of proton implantation 15. The processes following this has been discussed already in the second embodiment. The discussion for the following step is neglected for avoiding redundant discussion.

Figure 10:
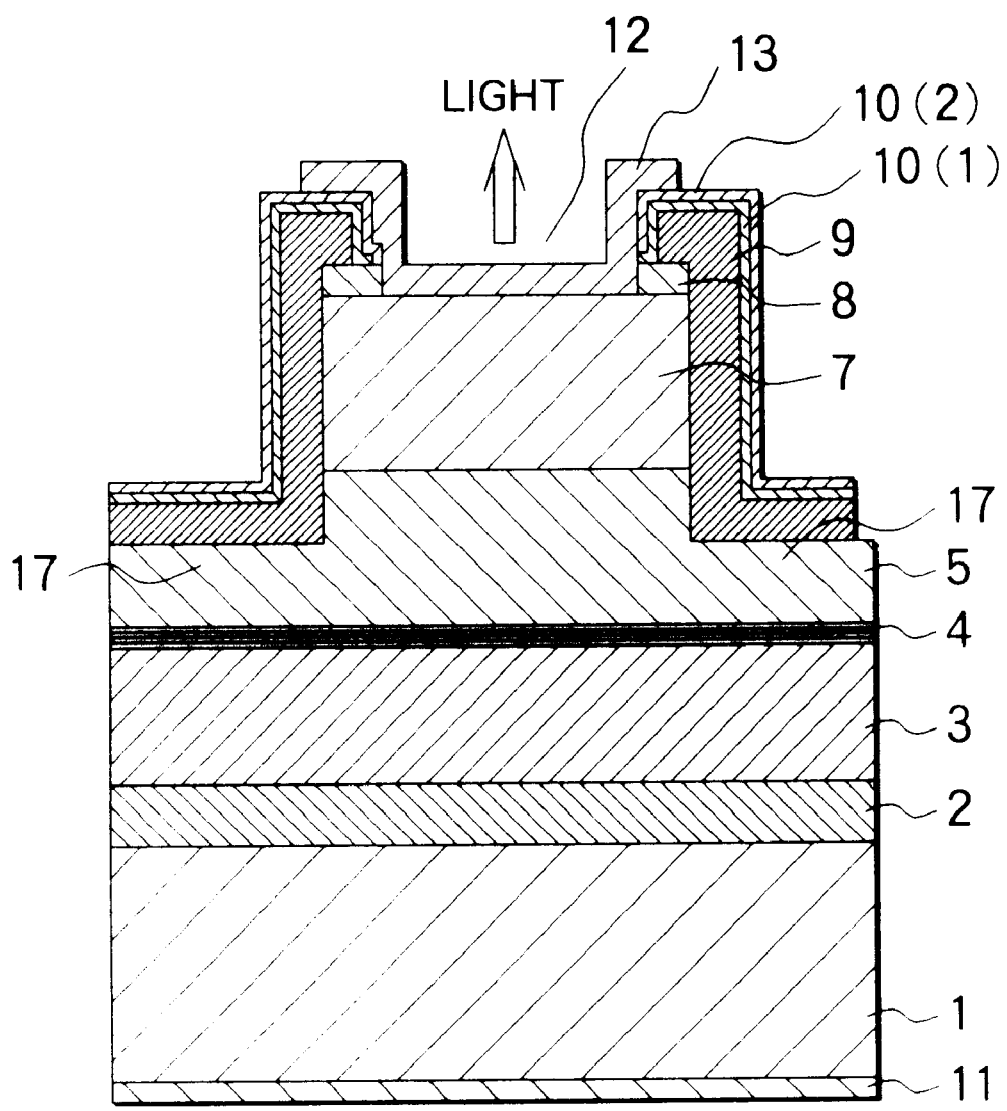
FIG. 10 is an illustration showing the fifth embodiment of the LED having mesa etched for avoiding spreading of a current at lower side of the bonding portion.

FIG. 10 is the explanatory diagram showing the proposed structure of the fifth embodiment of the LED according to the present invention. It should be noted that the like parts are represented by like reference numerals in the first embodiment so that the repeated explanation can be omitted. In the fifth embodiment, the thin layer 6 used in the first embodiment is not used. In the shown embodiment, the current is injected to the junction using the mesa structure having a slightly wider area than that of the light emitting surface. The bonding portion 17 is located outside the mesa structure. After mesa etching, the dielectric layer is deposited. Other processes following this step are the same as those described in the first embodiment. Therefore, discussed for the subsequent steps is neglected for maintaining the disclosure simple enough for facilitating clear understanding of the present invention. Owing to simple structure, this LED can be fabricated in low cost and thus is suitable for mass scale production.

Figure 11:
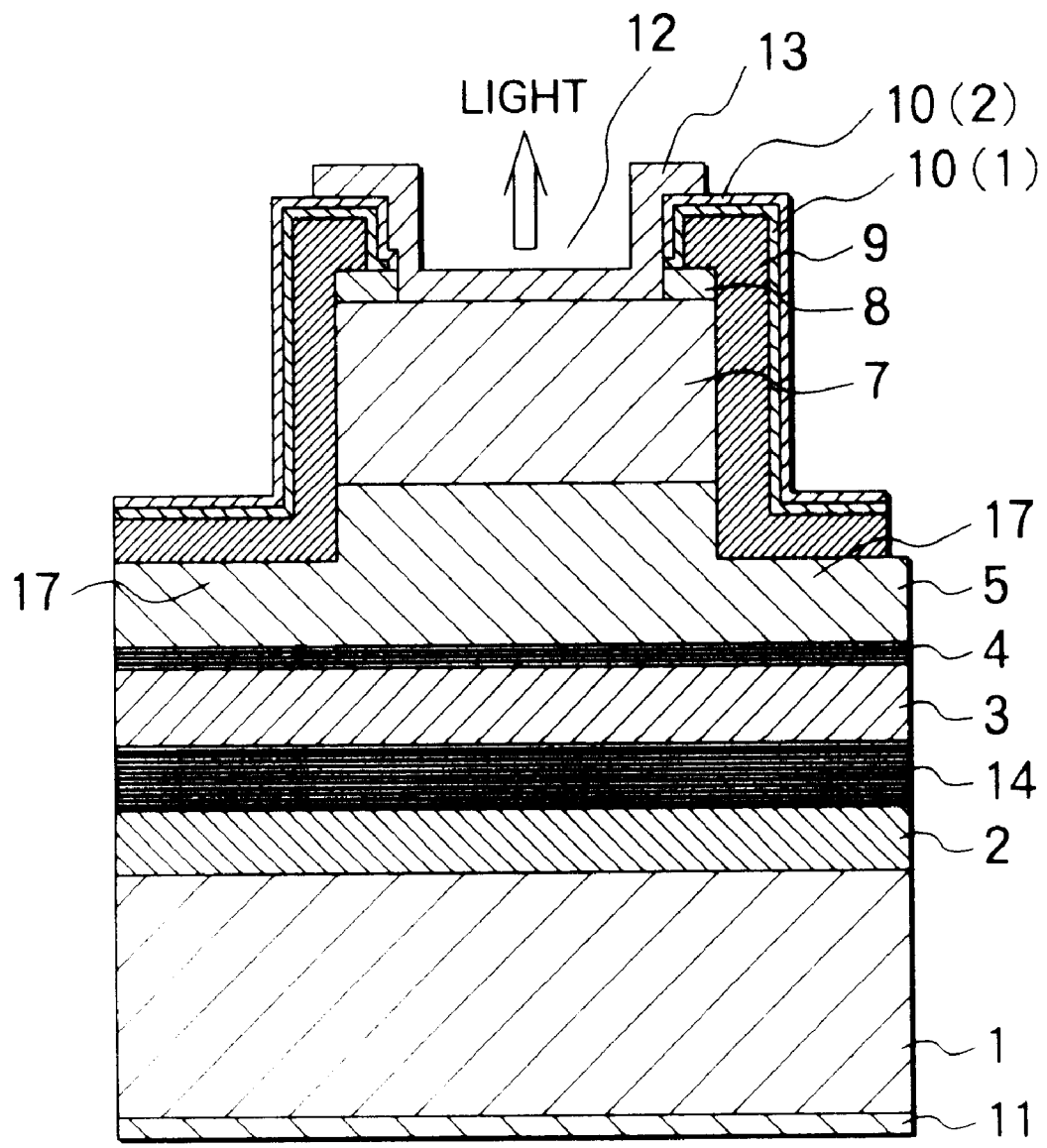
FIG. 11 is an illustration showing mesa etched the sixth embodiment of the LED having the bottomed DBR.

FIG. 11 is an explanatory diagram showing the proposed structure of the sixth embodiment of the LED according to the present invention. It should be noted that the like parts are represented by like reference numerals in the first, second and fifth embodiments so that the repeated explanation can be omitted. In the sixth embodiment, following the process step of growing the DBR 14, the n-type cladding layer 3, the active ;layer 4, the p-type cladding layer 5, the current spreading layer 7 and the cap layer 8 are subsequently grown on the DBR. Other processes following this step are the same as those described in the first embodiment. Therefore, discussed for the subsequent steps is neglected for maintaining the disclosure simple enough for facilitating clear understanding of the present invention.

Figure 12:
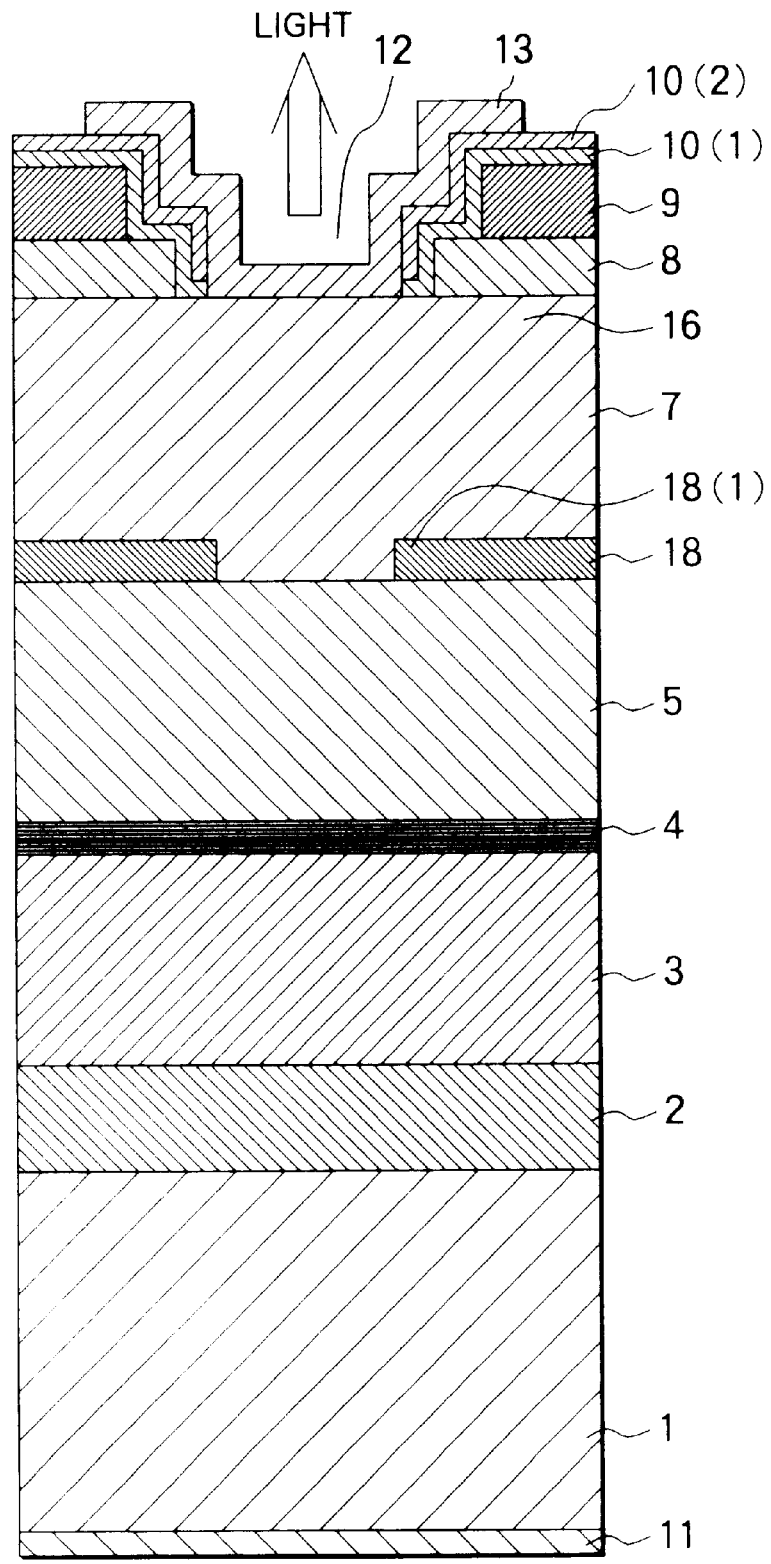
FIG. 12 is an illustration showing the seventh embodiment of the LED having a blocking layer for improving light output efficiency.

FIG. 12 shows an explanatory diagram illustrating the proposed structure of the seventh embodiment of the LED according to the present invention. It should be noted that the like parts are represented by like reference numerals in the first embodiment so that the repeated explanation can be omitted. In the shown embodiment, the thin layer 6 and the mesa etching area are required. Also, in the shown embodiment, for fabricating the LED, two steps of epitaxial growth are required. After growing the p-type cladding layer 5, a blocking layer 18 is to be grown and subsequently, a pattern is formed. The blocking layer 18 assists prevention of current from concentrating under the bonding region. As the blocking layer 18, the same n-type material, used as the cladding layer 3, may be used. After the patterning of blocking layer 18 is performed, the current spreading layer 7 and a high dope cap layer of GaAs 8 for the p-type contact are grown sequentially. Other processes following this step are the same as those described in the first embodiment. Therefore, discussed for the subsequent steps is neglected for maintaining the disclosure simple enough for facilitating clear understanding of the present invention. The use of the blocking layer 18 assists to inject current into the junction without spreading toward the bonding region and to enhance the light output efficiency.

Figure 13:
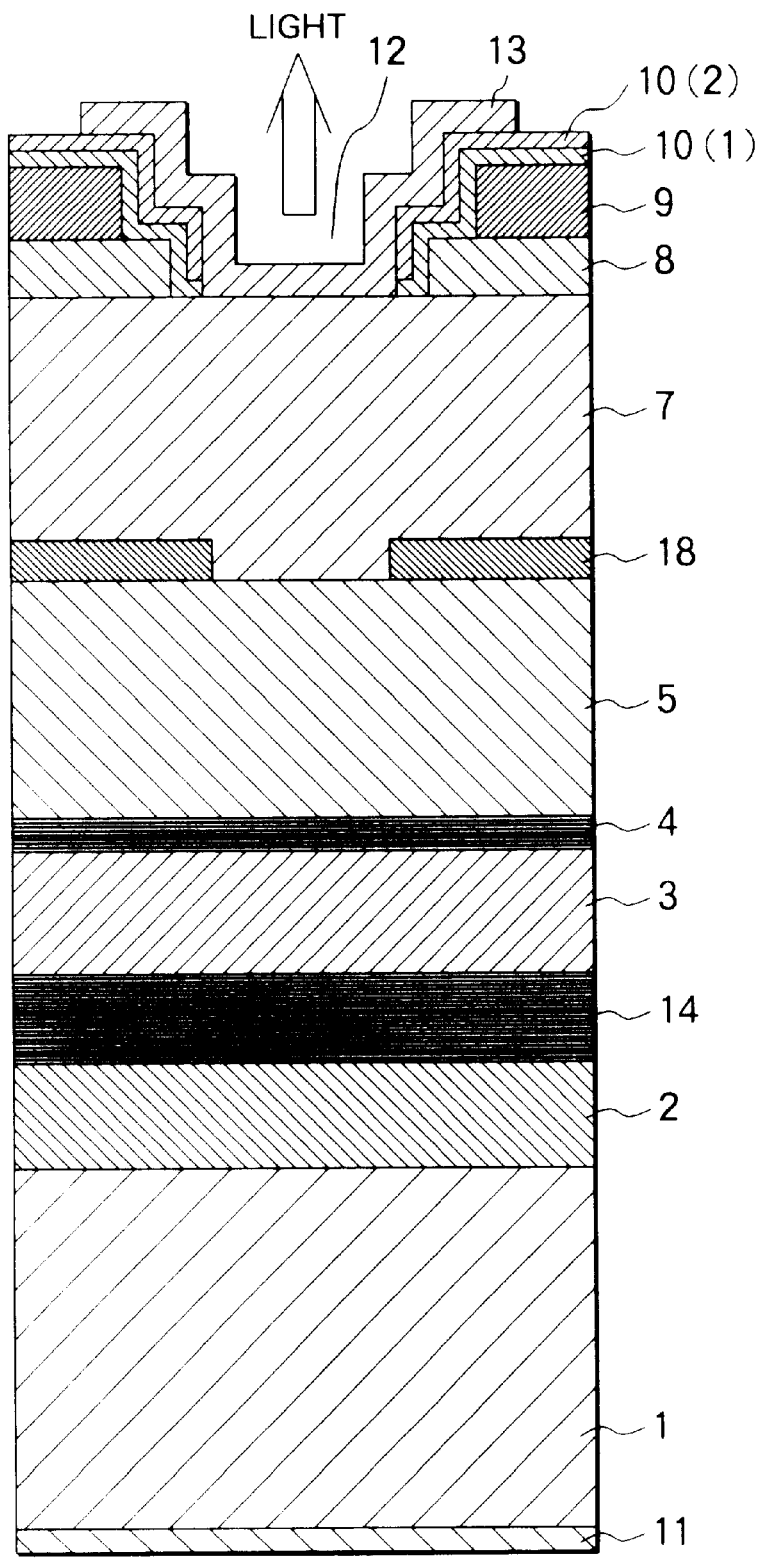
FIG. 13 is an illustration showing the eighth embodiment of the LED having a bottom electrode.

FIG. 13 is the explanatory diagram illustrating the proposed structure of the eighth embodiment of the LED. It should be noted that the like parts are represented by like reference numerals in the first, second and seventh embodiments so that the repeated explanation can be omitted. After formation of the DBR 14, the n-type cladding layer 3, the active layer 4, the p-type cladding layer 5 and the blocking layer 18 are grown sequentially. Other processes following this step are the same as those described in the second embodiment. Therefore, discussed for the subsequent steps is neglected for maintaining the disclosure simple enough for facilitating clear understanding of the present invention.

Figure 14:
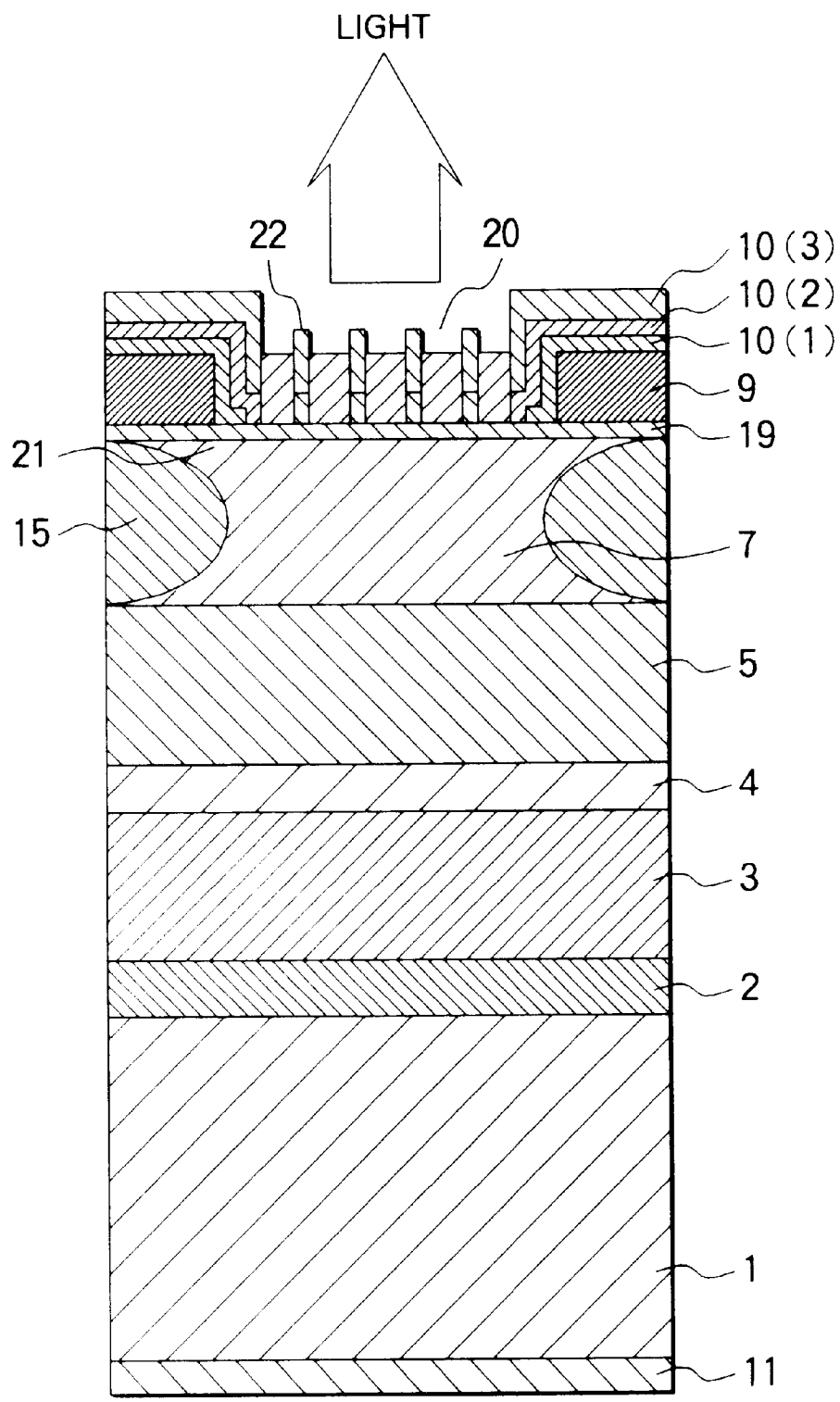
FIG. 14 is an illustration showing the ninth embodiment of the LED having a ring shaped electrode.

FIG. 14 is the explanatory diagram illustrating the proposed structure of the ninth embodiment of the LED according to the present invention. It should be noted that the like parts are represented by like reference numerals in the first embodiment so that the repeated explanation can be omitted. The thin layer 6, mesa etching, the extra passivation layer 13 used in the first embodiment, are not required. In the ninth embodiment, a thin layer of GaAs 19 in a thickness of 100 Å is to be used to form the p-type contact and also for avoiding the absorption of the emitted light. In addition, a ring (single or more than single) shaped top electrode is used to spread current uniformly in the spreading layer. Following to deposition of the dielectric material 9, a ring shaped window is opened through the dielectric material. Then, evaporation of the Au:Zn, Ni/Zn/Au or Cr:Au is carried out for the p-type contact. By the lift off, the ring electrode on the light emitting surface 20 is formed. Subsequently, Cr:Au evaporation on the bonding region 21 along with Au plating 22 covering entire electrode portion, to produce the LED. As the dielectric material is used for the purpose of bonding portion and also for passivation layer, it should be selected in such that no absorption occurs for the emitted light. For example, for 650 nm LED, silicon oxide or alumina may be used as dielectric material 19. Since only a few process steps are required for fabrication of the LED, the cost for fabrication of the chip can be minimized. It should be noted that while the shown embodiment forms the high resistance region in the current spreading layer by ion implantation, it may be an oxide blocking layer or an insulative blocking layer.

FIG. 15 is the explanatory diagram showing the mold structure for the tenth embodiment of the LED according to the invention. It should be noted that the like parts are represented by like reference numerals in the first, second and ninth embodiments so that the repeated explanation can be omitted. In the tenth embodiment, after formation of the DBR 14, the n-type cladding layer 3, the active layer 4, the p-type cladding layer, the current spreading layer and a thin GaAs layer are grown sequentially. Other processes following this step are the same as those described in the second embodiment. Therefore, discussed for the subsequent steps is neglected for maintaining the disclosure simple enough for facilitating clear understanding of the present invention.

Figure 16A:
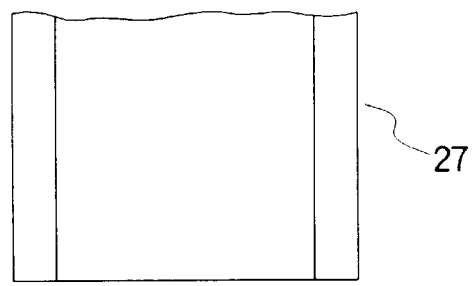
FIGS. 16A and 16B are illustrations showing a mold structure for the eleventh embodiment of the LED together with POF.
Figure 16B:
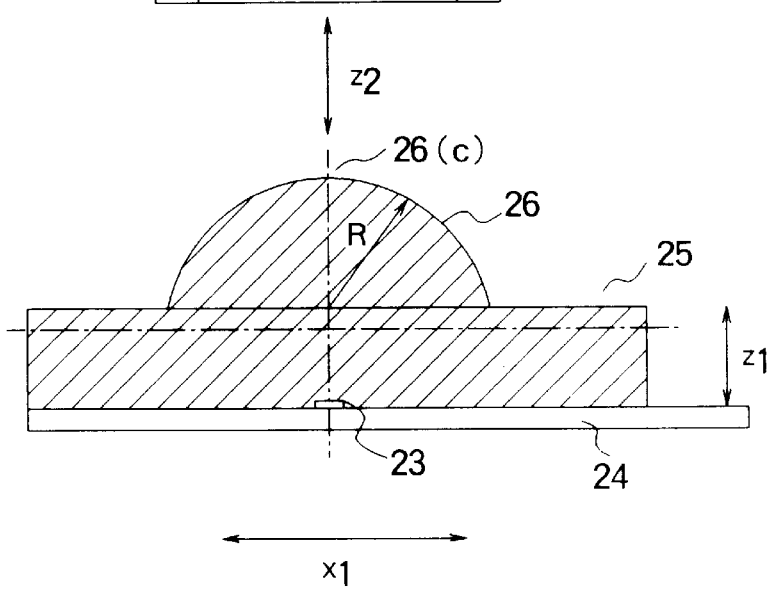

FIGS. 16A and 16B are the explanatory diagrams illustrating the mold structure for the eleventh embodiment of the LED according to the present invention. In the eleventh embodiment, after bonding the LED on a lead frame 24, molding 25 is performed for increasing the coupling efficiency. A lens 26 is formed during molding. For improving the coupling efficiency and also keeping the packaging cost as low as possible, the lens 26 to be used is also made from the same type of molding material. In POF 27 based data link application, radius (R) of the lens should be $\leq 0.6$ mm and distance of the LED from the center of the lens 26(c) should be as low as 0.75 mm. The material to be used for molding should have refractive index $n \leq 1.60$, and it should be made at a temperature less than 200° C.

Figure 18:
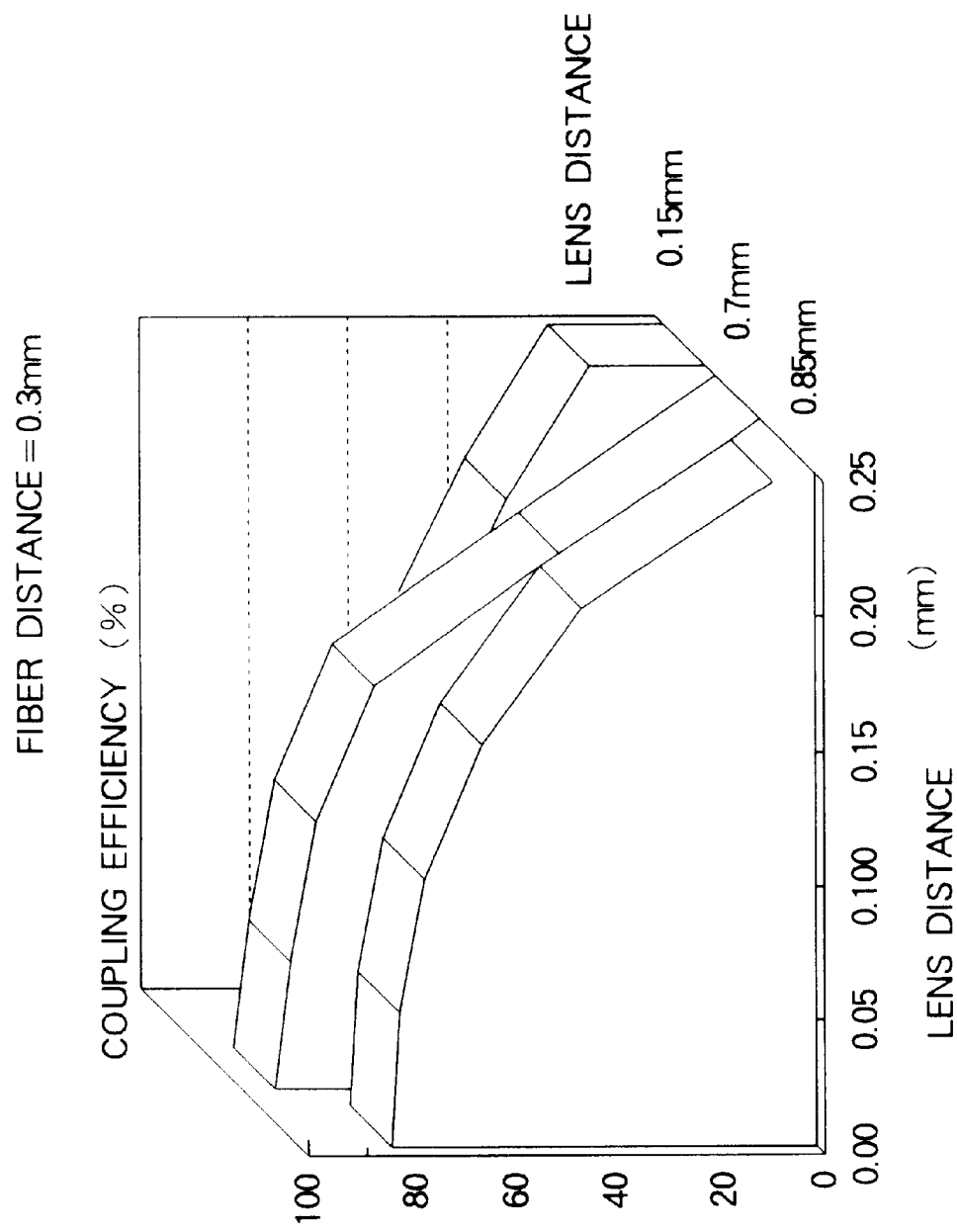
FIG. 18 is a graph showing a result of calculation showing dependencies of coupling efficiency on lens distance and fiber distance.

FIGS. 17 and 18 show result of evaluation for the molded lens as shown in FIG. 16. It is found that the use of the LED 23 with the mold 25 in the step index (SI) POF 27 having the numerical aperture (NA) of 0.5 and core diameter of 0.98 mm, can increase the coupling efficiency more than 80%. The position ($X_1$) of the LED 23 with respect to the lens center 26(c), the lens distance $Z_1$ and fiber distance $Z_2$ play an important role on the coupling efficiency. In order to achieve the coupling efficiency higher than or equal to 90%, the minimum $Z_1$ should be 0.7 mm.

In the preferred embodiment set forth above, the LED implementable in the POF based optical system is explained. The Si POF was used for showing the practicability of the proposed LED 23 as the optical source in the short distance data link system. However, it can be also used as an optical source in all types of POF or conventional silica fiber based system. Furthermore, the proposed LED is applicable in the outdoor application. The LED structure described in the preferred embodiment is also applicable for the LED of wavelength ranging from 0.5 to 1.6 µm.

The foregoing description of the preferred embodiments of the present invention has been presented for the purpose of illustration and description, and is not intended to limit the invention to the precise form disclosed. It has been chosen and described in order to best explain the principle of the invention and these can be utilized in various embodiments and with various modifications as are suited to the particular use contemplated.

In the present invention, the visible LED with the blocking layer under he bonding region exhibited higher output power as compared with the conventional one ever developed. It also exhibited coupling efficiency over 80% with the POF. The use of circular electrode along with circular light emitting surface assists for spreading the current uniformly outside the contact, making the LED high brightness and increasing the coupling efficiency higher than the LED ever fabricated.

What is claimed is:

1. A fabrication process of a surface emission type diode comprising the steps of:

sequentially stacking a first conductivity type buffer layer on a first conductivity type substrate, a first conductivity type cladding layer, an active layer, a second conductivity type cladding layer, a second conductivity type layer, a second conductivity type current spreading layer and a heavily doped second conductivity type cap layer, after mesa etching up to said second conductivity type cladding layer, forming a blocking layer by selective oxidation in said second conductivity type layer up to a mesa side wall with maintaining a center portion; and forming a molded lens having a refraction index less than or equal to 1.6, a lens diameter less than or equal to 0.6 mm, and a distance from said light-emitting surface of said surface emission type diode to a top at the center of the lens being less than or equal to 0.75 mm.

2. A fabrication process as claimed in claim 1, further comprising the step of forming a ring-shaped electrode having one or more electrode rings and being formed on a light-emitting surface side of said diode.

3. A fabrication process as claimed in claim 1, further comprising the step of forming a distributed Bragg reflector (DBR) mirror on said first conductivity type buffer layer.

4. A fabrication process as claimed in claim 2, further comprising the step of covering said ring electrode with an insulative material having transparency for radiated light.

5. A fabrication process for a surface emission type diode comprising the steps of:

sequentially stacking a first conductivity type GaAs layer on a first conductivity type substrate, a first conductivity type $(Al_{1-x}Ga_x)_{0.5}In_{0.5}P$ cladding layer, an active layer of bulk or quantum well structure of $(Al_{1-x}Ga_x)_{0.5}In_{0.5}P$, a second conductivity type cladding layer, a second conductivity type layer of $Al_xGa_{1-x}As$ ($0.9 \leq x \leq 1$), a second conductivity type $Al_xGa_{1-x}As$ ($0.7 \leq x \leq 1$) current spreading layer, a high doped second conductivity tap layer sequentially stacked with said first conductivity type buffer, said first conductivity type cladding layer, said active layer, said second conductivity type cladding layer, said second conductivity type thin layer and said second conductivity type current spreading layer on a first conductivity type substrate, forming a mesa structure by etching up to said second conductivity type cladding layer, forming a blocking layer after said mesa etching by selective oxidation in said second conductivity type layer up to a mesa side wall with maintaining a center portion, and forming a molded lens having a refraction index less than or equal to 1.6, a lens diameter less than or equal to 0.6 mm, and a distance from said light-emitting surface of said surface emission type diode to a top at the center of the lens being less than or equal to 0.75 mm.

* * * * *